United States Patent
Park et al.

(10) Patent No.: US 12,216,935 B2
(45) Date of Patent: Feb. 4, 2025

(54) STORAGE DEVICE AND OPERATING METHOD THEREOF THAT OUTPUTS STATUS INFORMATION AND READ DATA TOGETHER

(71) Applicant: SAMSUNG ELECTRONICS CO., LTD., Suwon-si (KR)

(72) Inventors: Hyungjoon Park, Seoul (KR); Youngho Gong, Seoul (KR); Hyeonwu Kim, Chilgok-gun (KR); Seokwon Ahn, Suwon-si (KR)

(73) Assignee: SAMSUNG ELECTRONICS CO, LTD., Suwon-si (KR)

( * ) Notice: Subject to any disclaimer, the term of this patent is extended or adjusted under 35 U.S.C. 154(b) by 0 days.

(21) Appl. No.: 17/067,698

(22) Filed: Oct. 11, 2020

(65) Prior Publication Data

US 2021/0208815 A1    Jul. 8, 2021

(30) Foreign Application Priority Data

Jan. 2, 2020    (KR) .................. 10-2020-0000484

(51) Int. Cl.
*G06F 3/06* (2006.01)

(52) U.S. Cl.
CPC .......... *G06F 3/0659* (2013.01); *G06F 3/0604* (2013.01); *G06F 3/0679* (2013.01)

(58) Field of Classification Search
CPC .... G06F 3/0659; G06F 3/0604; G06F 3/0679; G06F 2212/1016; G06F 12/0238;
(Continued)

(56) References Cited

U.S. PATENT DOCUMENTS 7,966,445 B2    6/2011  Hobler
8,370,699 B2    2/2013  Liu et al.
(Continued)

FOREIGN PATENT DOCUMENTS

KR    10-2007-0030008 A    3/2007
KR    10-1489827           1/2015

OTHER PUBLICATIONS

Extended European Search Reported Dated May 25, 2021 for European Application Serial No. 20217748.
(Continued)

*Primary Examiner* — Rocio Del Mar Perez-Velez
*Assistant Examiner* — Tong B. Vo
(74) *Attorney, Agent, or Firm* — F. CHAU & ASSOCIATES, LLC

(57) ABSTRACT

A method of operating a storage device that includes a nonvolatile memory device and a controller that controls an operation of the nonvolatile memory device includes issuing, by the controller, a first command to the nonvolatile memory device, reading, by the nonvolatile memory device, first data from a memory cell array into a page buffer of the nonvolatile memory device, in response to the first command, issuing, by the controller, a second command to the nonvolatile memory device, and outputting, by the nonvolatile memory device to the controller, in response to the second command, status information indicating whether a read operation according to the first command has been completed and second data obtained from the page buffer of the nonvolatile memory device.

20 Claims, 12 Drawing Sheets

(58) Field of Classification Search
CPC ......... G06F 2212/7203; G06F 12/1009; G06F 3/0658; G06F 3/061; G06F 3/0653; G06F 3/0656; G06F 13/1673; G06F 13/4243; G11C 16/26; G11C 16/32
See application file for complete search history.

(56) References Cited

U.S. PATENT DOCUMENTS

| | | | |
|---|---|---|---|
| 9,335,952 B2 | 5/2016 | Buxton et al. | |
| 9,336,112 B2 | 5/2016 | Schushan et al. | |
| 9,535,607 B2 | 1/2017 | Yun et al. | |
| 9,728,236 B1 | 8/2017 | Sankaranarayanan et al. | |
| 10,114,690 B2 | 10/2018 | Shah et al. | |
| 10,187,062 B1* | 1/2019 | Shimizu | G11C 29/50008 |
| 10,303,632 B2 | 5/2019 | Bell | |
| 2007/0068480 A1 | 3/2007 | Hwang | |
| 2011/0093647 A1 | 4/2011 | Lai et al. | |
| 2011/0264851 A1 | 10/2011 | Jeon et al. | |
| 2013/0080858 A1* | 3/2013 | Lee | G11C 11/5642 714/E11.054 |
| 2014/0204684 A1* | 7/2014 | Kwak | G11C 7/10 365/189.05 |
| 2014/0245105 A1* | 8/2014 | Chung | G06F 3/0604 714/763 |
| 2016/0085465 A1* | 3/2016 | Schmier | G06F 3/0653 711/103 |
| 2017/0206037 A1 | 7/2017 | Shin | |
| 2018/0081575 A1* | 3/2018 | Takada | G06F 12/08 |
| 2018/0232171 A1 | 8/2018 | Berke et al. | |
| 2019/0057746 A1* | 2/2019 | Komai | G11C 5/025 |
| 2019/0221265 A1* | 7/2019 | Inoue | G11C 16/26 |
| 2020/0304238 A1* | 9/2020 | Xiao | H04L 1/1642 |
| 2021/0035646 A1* | 2/2021 | Harada | G11C 16/32 |
| 2021/0096774 A1* | 4/2021 | Han | G06F 3/0619 |
| 2021/0109807 A1* | 4/2021 | Papandreou | G06F 11/1048 |
| 2021/0181985 A1* | 6/2021 | Shin | G06F 3/0659 |

OTHER PUBLICATIONS

Office Action dated Nov. 29, 2024, in corresponding Korean Patent Application No. 10-2020-0000484, 2 pages.

* cited by examiner

| Mode | Command | | Signal |
|---|---|---|---|
| Mode1 | CMD_R | CMD_SR | REB |
| | | CMD_O1 | |
| Mode2 | CMD_R | CMD_O2 | REB |

T1

STORAGE DEVICE AND OPERATING METHOD THEREOF THAT OUTPUTS STATUS INFORMATION AND READ DATA TOGETHER

CROSS-REFERENCE TO RELATED APPLICATION

This application claims priority under 35 U.S.C. § 119 from, and the benefit of, Korean Patent Application No. 10-2020-0000484, filed on Jan. 2, 2020 in the Korean Intellectual Property Office, the contents of which are herein incorporated by reference in their entirety.

BACKGROUND

Embodiments of the inventive concept are directed to a storage device, and more particularly, to a storage device that includes a nonvolatile memory device and a controller and an operating method thereof.

Recently, storage devices such as solid state drives (SSDs) have become widely used. Storage devices correspond to memory systems that include a nonvolatile memory device such as a flash memory and a controller that controls the nonvolatile memory device. With improved performance of storage devices, the input/output speed of data between a nonvolatile memory device and a controller in storage devices is increased. Thus, data may be transferred or received at a high speed between a controller and a nonvolatile memory device.

During a read operation, a controller may, after issuing a read command CMD, issue a status command CMD to identify whether the nonvolatile memory device has completed a read operation, and issues a readout command CMD only after the status command indicates READY so as to read data written to a storage device. When a command is transmitted from a controller to a nonvolatile memory device according to a timing parameter that has a predefined fixed time value, the input/output efficiency of the data transfer may decrease even though the data input/output speed is increased.

SUMMARY

Embodiments of the inventive concept provide a storage device that includes a nonvolatile memory device and a controller that can improve or maintain efficiency of input/output operations between the nonvolatile memory device and the controller and an operation method thereof.

According to an embodiment of the inventive concept, there is provided a method of operating a storage device that includes a nonvolatile memory device and a controller that controls operation of the nonvolatile memory device, the method including issuing, by the controller, a first command to the nonvolatile memory device, reading, by the nonvolatile memory device, first data from a memory cell array into a page buffer of the nonvolatile memory device, in response to the first command, issuing, by the controller, a second command to the nonvolatile memory device, and outputting, by the nonvolatile memory device to the controller, in response to the second command, status information indicating whether a read operation according to the first command has been completed and second data obtained from the page buffer of the nonvolatile memory device.

According to another embodiment of the inventive concept, there is provided a storage device that includes a nonvolatile memory device, and a controller that controls the nonvolatile memory device and issues a plurality of commands. The nonvolatile memory device includes a memory cell array that includes a plurality of memory cells and that reads first data in response to a first command, a control logic that controls a read operation of the memory cell array based on the plurality of commands, a page buffer that buffers the first data, and an input/output interface that, in response to a second command, outputs to the controller status information indicating whether the read operation has been completed and second data obtained by buffering the first data.

According to another embodiment of the inventive concept, there is provided a method of operating a storage device that includes a nonvolatile memory device and a controller that controls operation of the nonvolatile memory device, the method including issuing, by the controller, a first command to the nonvolatile memory device, reading, by the nonvolatile memory device, first data from a memory cell array in response to the first command, issuing, by the controller, in a first read mode, a second command for transferring to the controller status information indicating whether a read operation of the memory cell array according to the first command has been completed, and the first data, and transferring, by the nonvolatile memory device to the controller, the first data to the controller in response to the second command, and delaying output of the first data for a first time interval, in a busy status in which the reading of the first data has not been completed.

DETAILED DESCRIPTION OF EXEMPLARY EMBODIMENTS

Hereinafter, exemplary embodiments of the inventive concept will be described in detail with reference to the accompanying drawings.

Figure 1:
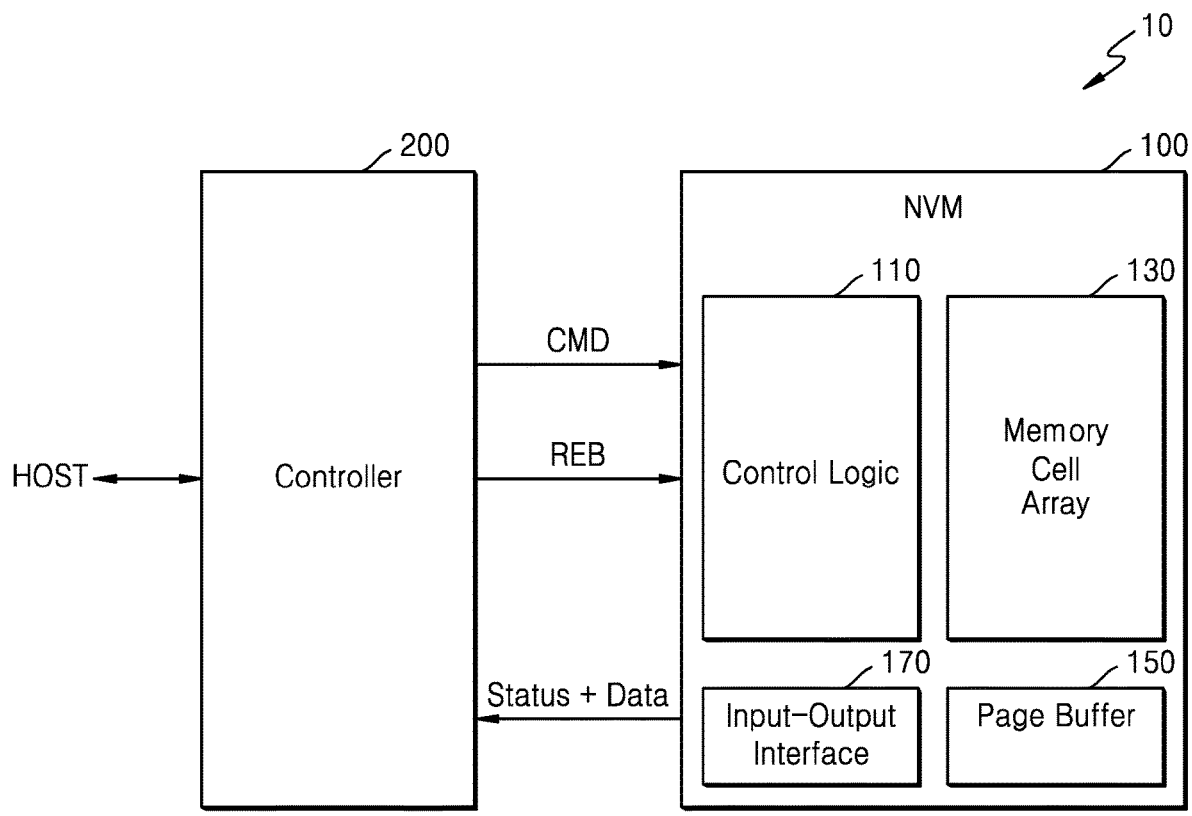
FIG. 1 is a block diagram that illustrates a storage device according to an embodiment.

FIG. 1 is a block diagram that illustrates a storage device according to an embodiment. Referring to FIG. 1, a storage device 10 includes a nonvolatile memory device (NVM) 100 and a controller 200.

According to an embodiment of the inventive concept, the controller 200 can issue a second readout command CMD that allows the nonvolatile memory device 100 to transfer both a status information signal Status and read data. Data to the controller 200, and the nonvolatile memory device 100 transfers both the status information signal Status and the read data Data to the controller 200 in response to the second readout command CMD. The status information signal Status includes a signal or data indicating whether the nonvolatile memory device 100 has completed an operation of reading from a memory cell array 130 in response to the read command CMD. The status information signal Status includes a ready status READY that indicates that the operation of reading from the memory cell array 130 has been completed and a busy status BUSY that indicates that the operation of reading from the memory cell array 130 is in progress, i.e., has not been completed.

According to an embodiment, the storage device 10 can be implemented as a storage device such as a solid state drive (SSD). However, embodiments of the inventive concept are not limited thereto, and thus the storage device 10 can be implemented as any of various types of devices, such as an embedded multimedia card (eMMC), a universal flash storage (UFS), a compact flash (CF), a secure digital (SD), a micro secure digital (micro-SD), a mini secure digital (mini-SD), an extreme digital (xD), memory stick, etc.

According to an embodiment, the storage device 10 can communicate with a host HOST via any of various interfaces. The host HOST can request a data processing operation of the storage device 10, such as a data read operation or a data write operation. In an embodiment, the host HOST corresponds with a CPU, a processor, a microprocessor, an application processor (AP), etc. According to an embodiment, the host HOST is implemented as a system-on-a-chip (SoC).

According to an embodiment, an interface for communication between the storage device 10 and the host HOST may be any of various interface types, such as an advanced technology attachment (ATA), a serial ATA (SATA), an external SATA (e-SATA), a small computer small interface (SCSI), a serial attached SCSI (SAS), a peripheral component interconnection (PCI), a PCI-express (PCI-E), an IEEE 1394, a universal serial bus (USB), an SD digital card, a multi media card (MMC), an embedded MMC (eMMC), a CF card interface, etc.

According to an embodiment, the nonvolatile memory device 100 receives the command CMD and a read enable signal REB generated by the controller in response to a request received from the host HOST. The nonvolatile memory device 100 includes a control logic 110, the memory cell array 130, a page buffer 150, and an input/output interface 170.

According to an embodiment, the control logic 110 controls an overall operation of the nonvolatile memory device 100. The control logic 110 controls operation of a plurality of memory cells included in the nonvolatile memory device 100 based on the command CMD received from the controller 200. In addition, the control logic 110 receives an address and controls the plurality of memory cells based on the command CMD and the address.

According to an embodiment, the control logic 110 receives the command CMD from the input/output interface 170 or a command buffer in which the command CMD and/or address is buffered. In this case, the command buffer or the input/output interface 170 operates at a first operation speed that corresponds to a data input/output speed between the nonvolatile memory device 100 and the controller 200, and the control logic 110 operates at a second operation speed that is lower than the first operation speed. That is, an internal operation speed of the nonvolatile memory device 100 corresponds to the second operation speed. However, for convenience of illustration, a configuration such as an additional input/output interface is not illustrated in FIG. 1.

According to an embodiment, the control logic 110 receives the read enable signal REB from the controller 200. In an embodiment, the read enable signal REB is enabled, e.g., toggled to indicate a status transition, by the controller 200 during a read operation of the memory cell array 130. Furthermore, the read enable signal REB synchronizes a signal, such as a data strobe signal, for transferring read data. Here, an operation of enabling a signal represents an operation in which a signal level transitions to a different logic level, and, thus, a phase of the signal may change from 0 degree to 180 degrees or from 180 degrees to 0 degree.

According, to an embodiment, the control logic 110 controls program, read, and erase operations for the memory cell array 130. The control logic 110 will be described in more detail with reference to FIG. 3.

According to an embodiment, the memory cell array 130 includes a plurality of memory cells. Each of the plurality of memory cells functions as a unit storage device for writing and reading information. A memory bank may be present, which is a logical partition in which predetermined memory cells of the plurality of memory cells are grouped. Data can be written to or read from the memory cell array 130 on a memory bank-by-memory bank basis, but embodiments are not limited thereto.

In an embodiment, the plurality of memory cells includes a plurality of flash memory cells. For example, the plurality of flash memory cells includes NAND flash memory cells. However, embodiments of the inventive concept are not limited thereto, and, thus, the plurality of memory cells may include resistive memory cells such as resistive RAM (Re-RAM), phase change RAM (PRAM), or magnetic RAM (MRAM).

According to an embodiment, the memory cell array 130 writes data to memory cells selected from the plurality of memory cells or reads written data based on control of the control logic 110. The read data Data is output to the page buffer 150, and the output read data Data is buffered in the page buffer 150.

According to an embodiment, the page buffer 150 buffers the received read data Data. The page buffer 150 temporarily stores received data and includes at least one register, in an embodiment, the page buffer 150 sequentially buffers data using a plurality of page buffer groups. The page buffer 150 will be described in more detail with reference to FIG. 3.

According to an embodiment, the input/output interface 170 receives the status information signal Status from the control logic 110 and receives the read data. Data from the page buffer 150. According to an embodiment of the inventive concept, the input/output interface 170 transfers the status information signal Status and the read data Data to the controller 200 in response to the second readout command from the controller 200. In an embodiment, the input/output interface 170 transfer the status information signal Status to the controller 200 before transferring the read data Data.

According to an embodiment, the input/output interface 170 is electrically connected to the controller 200 via an input/output channel. In other words, the status information signal Status and the read data Data are transferred to the controller 200 according to a data input/output speed.

According to an embodiment, the controller 200 receives the status information signal Status and the read data. Data from the nonvolatile memory device 100. According to an embodiment, the controller 200 is referred to as a memory controller or a storage controller.

According to an embodiment, the controller 200 controls the nonvolatile memory device 100 so as to read data stored in the nonvolatile memory device 100 or write data, i.e., program data, to the nonvolatile memory device 100 in response to a request from the host HOST or a predetermined read/write signal. In an embodiment, the controller 200 provides the command CMD to the nonvolatile memory device 100 to control program, read, and erase operations for the nonvolatile memory device 100. Furthermore, the data Data to be programmed and the read data. Data are transferred/received between the controller 200 and the nonvolatile memory device 100. For example, the command CMD is one of a write command, a read command, an erase command, etc. The read command includes a read command CMD_R, a status read command CMD_SR, and a first readout command CMD_O1, and further includes a second readout command CMD_O2. The second readout command CMD_O2 is a smart readout command in that the second readout command CMD_O2 is issued to receive both the status information signal Status and the read data Data.

According to an embodiment, the controller 200 receives both the status information signal Status and the read data Data by issuing the second readout command CMD_O2, and the controller 200 continues to receive data from the nonvolatile memory device 100 or stops data reception based on the received status information signal Status.

In an embodiment, based on a set read mode, the controller 200 operates in a second read mode in which the second readout command CMD_O2 is issued a predetermined time after issuing the read command CDER, or operates in a first second-read mode in which the status read command CMD_SR is issued a predetermined time after issuing the read command CMD_R. In the case of the second read mode, the nonvolatile memory device 100 transmits the status information signal Status to the controller 200 separately from the read data Data in response to the status read command CMD_SR, and the controller 200 may further issue the first readout command CMD_O1 or may reissue the status read command CMD_SR based on the received status information signal Status. The storage device 10, including the controller 200 and the nonvolatile memory device 100, will be described in more detail in relation to a read command with reference to FIGS. 7 to 12. In an embodiment, the read mode is set based on a mode signal received from an external device, such as the host HOST. However, embodiments are not limited thereto, and, thus, the read mode may be set in advance when the storage device 10 is manufactured.

According to an embodiment, the controller 200 generates and transmits the read enable signal REB to the nonvolatile memory device 100. The read enable signal REB synchronizes a signal, such as a data strobe signal, for transferring, the read data Data. Here, a data strobe signal DQS is generated by the nonvolatile memory device 100 in response to the read enable signal REB. In an embodiment, the data strobe signal DQS functions as a clock signal for outputting data of the nonvolatile memory device 100. In other words, the read enable signal REB is related to driving a clock signal for outputting the read data Data and the status information signal Status.

According to an embodiment, the nonvolatile memory device 100 and the controller 200 are electrically connected via input/output interfaces respectively included therein, in which the input/output interfaces are connected by a pin. That is, each of the nonvolatile memory device 100 and the controller 200 includes a plurality of input/output pins DQ.

According to an embodiment, of the plurality of input/output pins DQ in each of the nonvolatile memory device 100 and the controller 200, a first pin is an input/output pin, a second pin is a clock pin, a third pin is a command latch enable signal, and a fourth pin is an address latch enable signal. Furthermore, a separate pin for the data strobe signal DQS related to output of the read data Data is included. However, embodiments are not limited thereto, and, thus, at least one of the plurality of pins DQ may be used as a data pin through which data is transferred, or all of the plurality of pins DQ may be used as data pins through which data is transferred.

According to an embodiment, since the command CMD has a predefined fixed time duration, a ratio of the predefined fixed time duration to a total data processing time gradually increases as a data input/output speed increases, thus causing reduction of input/output efficiency. According to an embodiment of the inventive concept, since the nonvolatile memory device 100 transfers both the status information signal Status and the read data Data to the controller 200, the controller 200 can instantly check a status of the nonvolatile memory device 100, and, thus, a waiting time for issuing the command CMD can be reduced. Here, transmission of both of the status information signal Status and the read data Data does not represent simultaneous transmission but rather separate transmission of the status information signal Status and the read data Data via the same channel. That is, the status information signal Status and the read data Data are transferred in response to the same second readout command CMD received from the controller 200. Therefore, efficiency of data input/output between the nonvolatile memory device 100 and the controller 200 is improved.

According to an embodiment, the storage device 10 and the host HOST constitute a storage system, in which the storage system is implemented as, for example, a personal computer (PC), a data server, a network-attached storage, an Internet of things (IoT) device, or a mobile electronic device. The mobile electronic device may be a laptop computer, a mobile phone, a smartphone, a tablet PC, a personal digital assistant (PDA), an enterprise digital assistant (FDA), a digital still camera, a digital video camera, an audio device, a portable multimedia player (PMP), a personal navigation device (PND), an MP3 player, a handheld game console, an e-book, a wearable device, etc.

Figure 2:
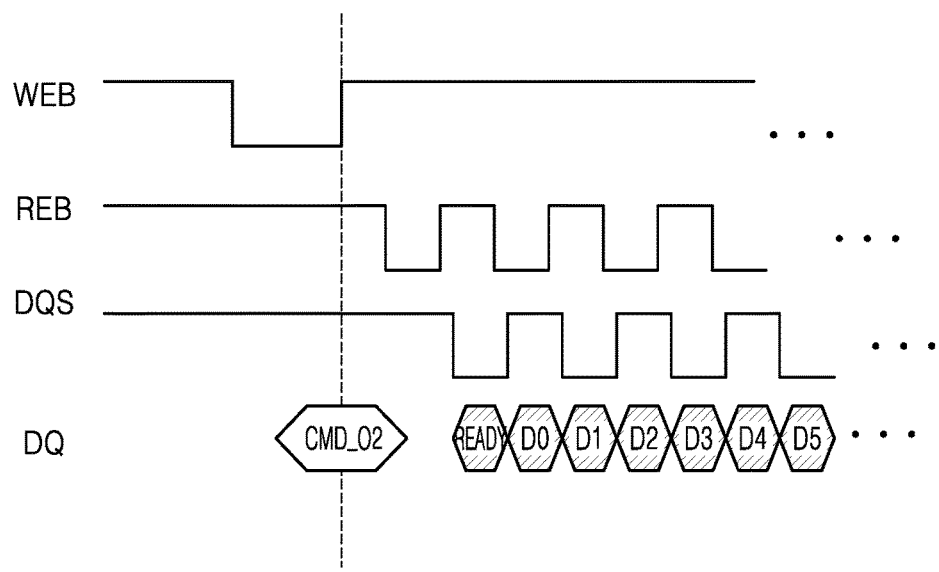
FIG. 2 is a timing diagram that illustrates a time sequence of signals and commands generated and issued in a storage device according to an embodiment.

FIG. 2 is a timing diagram that illustrates a time sequence of signals and commands generated and issued by a storage device according to an embodiment. In the timing diagram of FIG. 2, the horizontal axis denotes time, and the vertical axis denotes a high (or data "1")/low (or data "0") signal level.

Referring to FIGS. 1 and 2, according to an embodiment, the controller 200 issues the read command CMD_R, the status read command CMD_SR, the first readout command CMD_O1, and the second readout command CMD_O2, and transfers the issued command CMD to the nonvolatile memory device 100. The nonvolatile memory device 100 transfers to the controller 200 the status information signal Status, such as a ready status READY that indicates that reading has been completed, or a busy status BUSY that indicates that reading has not been completed, of the nonvolatile memory device 100 in response to the status read command CMD_SR or the second readout command CMD_O2. In other words, the ready status READY represents a status of the nonvolatile memory device 100 in which the nonvolatile memory device 100 is ready to perform an operation that corresponds to a request of the controller 200. The busy status BUSY represents a status in which memory cells are operating, such as a status in which an operation that corresponds to a request of the controller 200 is unable to be performed.

According to an embodiment, the controller 200 generates the read enable signal REB and a write enable signal WEB based on the status information signal Status. The write enable signal WEB is enabled during a write operation of the memory cell array 130 and synchronizes with the data strobe signal DQS to write data.

According to an embodiment of the inventive concept, the controller 200 issues and transfers the second readout command CMD_O2 to the nonvolatile memory device 100. The second readout command CMD_O2 is for transferring the read data Data read from the memory cell array 130 together with the status information signal Status about the memory cell array 130. The controller 200 transitions the write enable signal WEB, which is transferred to the nonvolatile memory device 100, and writes the second readout command CMD_O2 at a time during which the write enable signal transitions. For example, the second readout command CMD_O2 may be synchronized with a rising edge of the write enable signal WEB. Although FIG. 2 illustrates the second readout command CMD_O2 as being synchronized with a rising edge of the write enable signal WEB, the second readout command CMD_O2 may also be synchronized with a failing edge of the write enable signal WEB.

According to an embodiment, the nonvolatile memory device 100 receives the second readout command CMD_O2 from the controller 200 and generates the status information signal Status. The nonvolatile memory device 100 generates the read data Data by reading data if the nonvolatile memory device 100 is in a state indicated by the ready status READY, generates additional information INFO that includes power information or fault information about the memory cell array if the nonvolatile memory device 100 is not in the state indicated by the ready status READY in the state indicated by the busy status BUSY, and transfers a data stream that includes the status information signal Status and the read data Data or the status information signal Status and the additional information INFO to the controller 200.

According to an embodiment, the controller 200 can determine whether the nonvolatile memory device 100 is ready, by receiving the status information signal Status. The controller 200 can confirm that the status information signal Status indicates the ready status READY and starts to toggle the read enable signal REB. Toggling the read enable signal REB starts a predetermined time after the write enable signal WEB transitions to a logic high level. In other words, toggling of the read enable signal REB starts after the elapse of a time period that corresponds to a status information reception procedure of the nonvolatile memory device 100 after the write enable signal WEB transitions to a logic high level.

According to an embodiment, the nonvolatile memory device 100 starts toggling the data strobe signal DQS in response to the toggling of the received read enable signal REB. The data strobe signal DQS functions as a clock signal for outputting data of the nonvolatile memory device 100. That is, the read data Data read from the nonvolatile memory device 100 is output to the controller 200 in synchronization with the toggling of the data strobe signal DQS. The read enable signal REB and the data strobe signal DQS will be toggled until the status information signal Status and the read data Data are transferred. In an embodiment, the read data Data and the status information signal Status are synchronized with a falling edge of the data strobe signal DQS. In an embodiment, the read data Data and the status information signal Status are synchronized with a rising edge and falling edge of the data strobe signal DQS and thus are transferred to the nonvolatile memory device 100 in a double data rate (DDR) mode. Therefore, not only a transfer speed of the read data Data and the status information signal Status but also a transfer speed of the command CMD and address can be improved.

According to an embodiment, the input/output interface 170 of the nonvolatile memory device 100 transfers the status information signal Status and the read data Data to the controller 200. A data stream that it includes the status information signal Status and the read data. Data is transferred to the controller 200 via the plurality of pins DQ of the input/output interface 170, and the controller 200 receives the data stream via a plurality of pins of an input/output interface that corresponds to the plurality of pins DQ of the input/output interface 170.

According to an embodiment, the status information signal Status is output in synchronization with a first edge via the plurality of pins DQ of the input/output interface 170. In an embodiment, a ready status READY that indicates that data can be read from the nonvolatile memory device 100 is transferred to the controller 200 via the plurality of pins DQ. Consecutively, the read data Data is transferred to the controller 200 in synchronization with a second edge via the plurality of pins DQ (D0). Consecutively, the read data Data is transferred to the controller 200 in synchronization with a third edge via the plurality of pins DQ (D1). Likewise, the read data Data is transferred to the controller 200 in synchronization with a (N+2)th edge via the plurality of pins DQ (DN), where N is a natural number greater than or equal to 1.

Figure 3:
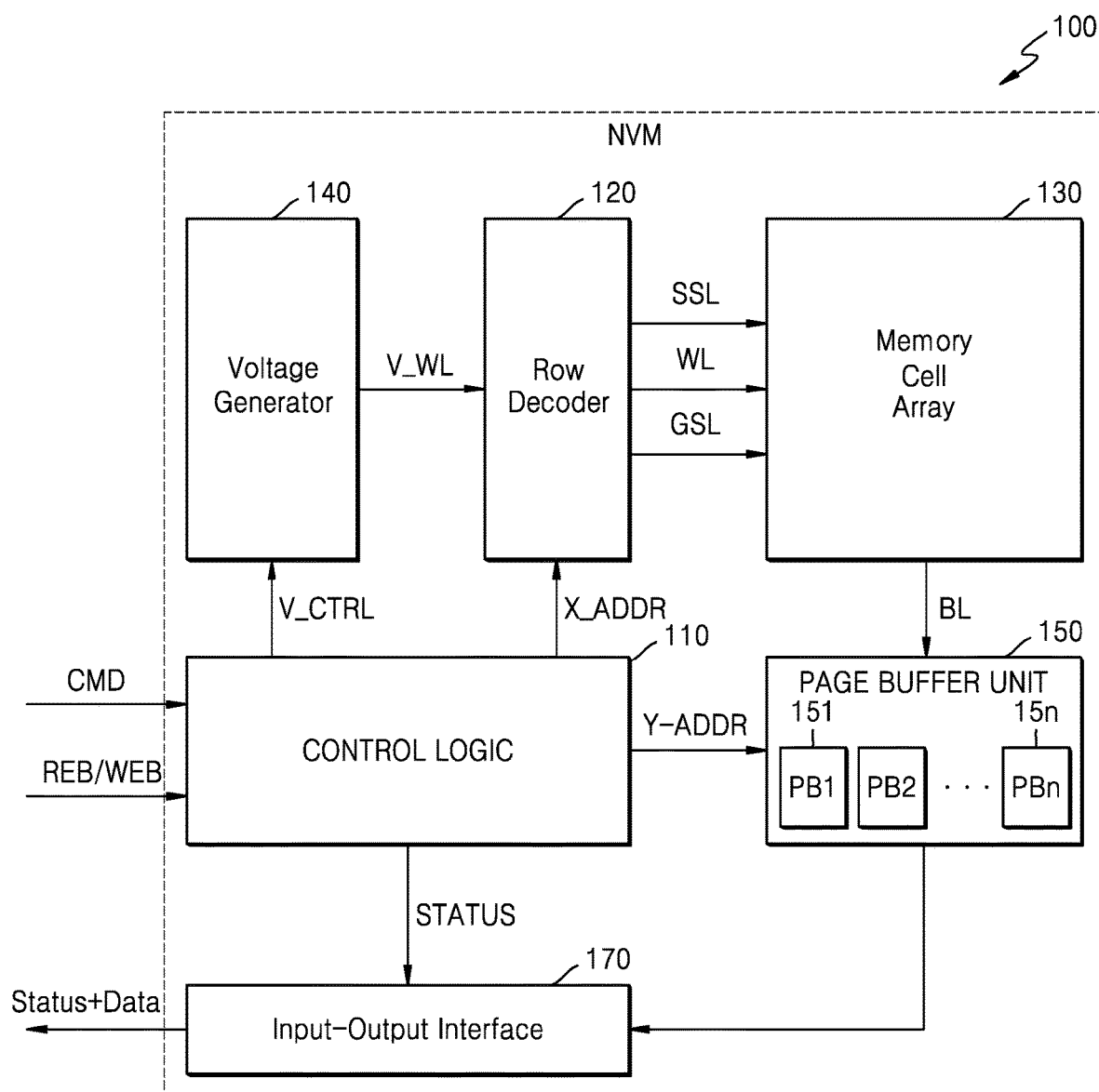
FIG. 3 illustrates a nonvolatile memory device according to an embodiment.

FIG. 3 illustrates a nonvolatile memory device according to an embodiment.

Reference is made to both FIGS. 1 and 3. According to an embodiment, the nonvolatile memory device 100 includes the control logic 110, a row decoder 120, the memory cell array 130, a voltage generator 140, the page buffer 150, and the input/output interface 170, in which the page buffer 150 further includes a plurality of page buffer cells PB1 151 to PBn 15*n*. The nonvolatile memory device 100 according to the present embodiment corresponds to an embodiment of the storage device 10 of FIG. 1, and the above descriptions provided above with reference to FIGS. 1 and 2 apply to a present embodiment. The descriptions given above with reference to FIGS. 1 and 2 are omitted below.

According to an embodiment, the control logic 110 receives the command CMD, the read enable signal REB, and the write enable signal WEB from the controller 200. For convenience, FIG. 3 illustrates the control logic 110 as directly receiving the command CMD, the read enable signal REB, and the write enable signal WEB. However, embodiments are not limited thereto, and, thus, in other embodiments, the control logic 110 receives the command CMD, the read enable signal REB, and the write enable signal WEB via a different channel, such as a separate input/output interface, etc.

According to an embodiment, the control logic 110 generates and transmits a voltage control signal V_CTRL to the voltage generator 140 that controls a supply of power and generates and transmits a row address signal X-ADDR to the memory cell array 130 that controls the memory cell array 130 on a string select line (SSL)-by-SSL basis and on a word line (WL)-by-WL basis, and a column address signal Y-ADDR that controls buffering of the page buffer 150 on a bit line (BL)-by-BL basis. Therefore, the control logic 110 controls various operations of the nonvolatile memory device 100.

According to an embodiment, the row decoder 120 selects some of a plurality of word lines WL based on the row address signal X-ADDR and activates the selected word lines WL. The row decoder 120 receives a word line voltage V_WL from the voltage generator 140 that corresponds to an operation mode and applies the word line voltage V_WL to the word line WL of a selected memory cell or memory block. During a program operation, the row decoder 120 applies a program voltage Vpgm and a program verification voltage Vpgm_vfy to the selected word line WL and applies a program pass voltage Vpgm_pass to a non-selected word line. During an erase operation, the row decoder 120 applies an erase voltage Vera and an erase verification voltage Vera_vfy to the selected word line WL and applies an erase pass voltage Vera_pass to a non-selected word line. During a read operation, the row decoder 120 transfers a read voltage Vr to the selected word line WL and a read pass voltage Vr_pass to a non-selected word line. Although the read operation is described as being performed by providing the read voltage Vr, a read operation according to an embodiment of the inventive concept can be performed using not only the read voltage Vr but also the program verification voltage Vpgm_vfy and the erase verification voltage Vera_pass for the erase operation.

According to an embodiment, the memory cell array 130 includes a plurality of memory cells, which constitute a plurality of memory pages or a plurality of memory banks. The memory cell array 130 is connected to the row decoder 120 via the word line WL and selection lines SSL and GSL, and is connected to the page buffer 150 via bit lines BL. Each of the plurality of memory cells includes a plurality of memory cells arranged in regions in which a plurality of word lines and a plurality of bit lines intersect. The memory cells can be programmed, erased, or read by voltages provided to the bit line BL and the word line WL.

In an embodiment, the memory cell array 130 include a three-dimensional memory cell array, which includes a plurality of NAND strings, in which each of the NAND strings include memory cells respectively connected to word lines stacked vertically on a substrate. In some embodiments, the memory cell array 130 includes a two-dimensional memory cell array, which includes a plurality of NAND strings arranged in rows and columns.

According to an embodiment, the voltage generator 140 generates the word line voltage V_WL that drives the plurality of word lines WL based on control signals received from the control logic 110. The word line voltage V_WL includes a program voltage, a read voltage, an erase voltage, or a pass voltage. The generated word line voltage V_WL is transmitted to the row decoder 120 to select some word lines and activate the selected word lines WL.

According to an embodiment, the page buffer 150 includes the plurality of page buffer cells 151 to 15n, where n is a natural number greater than or equal to 2. The page buffer 150 stores data to be recorded in the memory cell array 130 or data read from the memory cell array 130. The page buffer 150 may include a plurality of page buffer groups, each of which includes the page buffer cells 151 to 15n. In an embodiment, the number of page buffer groups corresponds to the number of memory pages or memory banks, and the number of the page buffer cells 151 to 15n in each of the page buffer groups corresponds to the number of bit lines BL in each of a plurality of memory banks or a plurality of memory pages.

According to an embodiment, when a read operation is performed on the memory device 100, the page buffer 150 stores data of some memory cells selected from the plurality of memory cells in the memory cell array 130, according to a read signal provided to a word line of the selected memory cells. For example, each of the plurality of page buffers includes at least one latch and latches data of memory cells when a latch signal is provided to the at least one latch.

According to an embodiment, the page buffer 150 selects some of bit lines BL in response to the column address signal Y-ADDR. In detail, the page buffer 150 operates as a write driver or a sense amplifier according to an operation mode. For example, the page buffer 150 operates as a sense amplifier to output data stored in the memory cell array 130 during a read operation, and the page buffer 150 operates as a write driver to input data to the memory cell array 130 to be stored during a program operation.

In an embodiment, the page buffer 150 includes a plurality of page buffer groups, each of which includes the plurality of page buffer cells 151 to 15n. For example, the number of the plurality of page buffer groups corresponds to the number of memory banks or memory pages of the memory cell array.

According to an embodiment, the input/output interface 170 receives the status information signal Status from the control logic 110 and receives the read data Data from the page buffer 150. According to an embodiment of the inventive concept, the input/output interface 170 transfers the status information signal Status and the read data Data to the controller 200 in response to the second readout command CMD_O2 received from the controller 200. In an embodiment, the input/output interface 170 transfers the status information signal Status to the controller 200 before transferring the read data Data.

Figure 4:
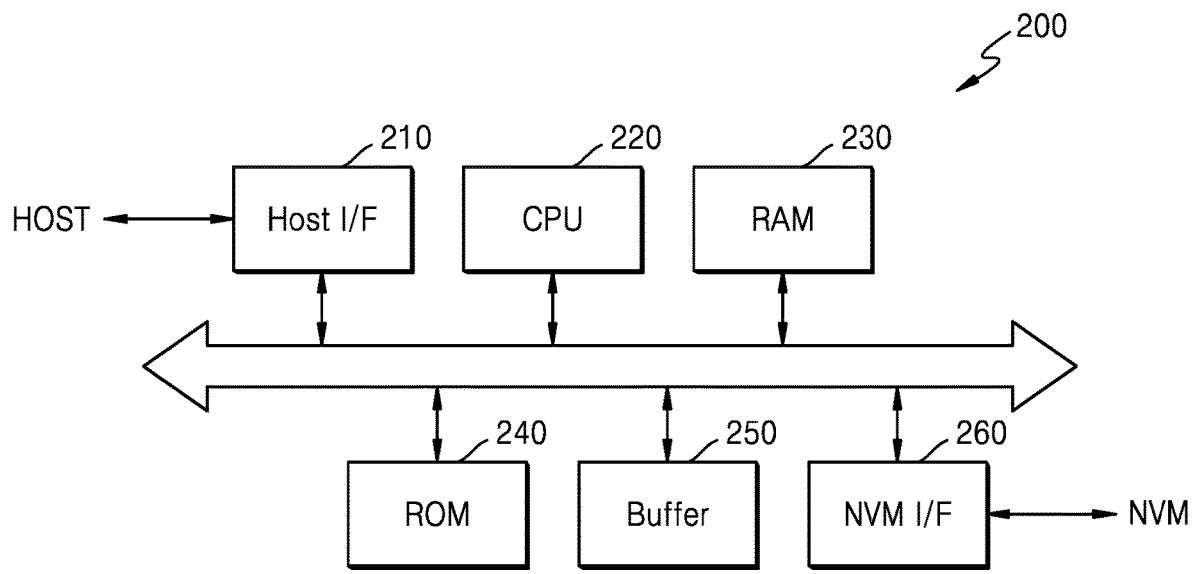
FIG. 4 is a block diagram of a controller according to an embodiment.

FIG. 4 is a block diagram of a controller according to an embodiment.

According to an embodiment, the controller 200 includes a host interface (I/F) 210, a central processing unit (CPU) 220, a random access memory (RAM) 230, a read only memory (ROM) 240, a buffer 250, and a memory interface (NVM I/F) 260, in which the foregoing components communicate via a bus.

According to an embodiment, the controller 200 generates an address and the command CMD, such as a program command, a read command, or an erase command, to control an operation of the nonvolatile memory device 100, such as a program operation, a read operation, or an erase operation. The program operation and the read operation are performed on a page-by-page basis, and the erase operation is performed on a block-by-block basis, but embodiments are not limited thereto.

According to an embodiment, the controller 200 receives the status information signal Status and the read data Data from the nonvolatile memory device 100. The controller 200 provides the command CMD to the nonvolatile memory device 100 to control program, read, and erase operations for the nonvolatile memory device 100. The controller 200 according to an embodiment of the inventive concept receives both the status information signal Status and the read data Data by issuing the second readout command CMD_O2, and the controller 200 continues to receive data from the nonvolatile memory device 100 or stops data reception based on the received status information signal Status.

According to an embodiment, the controller 200 outputs, to the nonvolatile memory device 100, the command CMD to control an operation of the nonvolatile memory device 100. The nonvolatile memory device 100 and the memory controller 200 are electrically connected via the plurality of input/output pins DQ, and the command CMD, the data, an address signal, the status information signal Status, etc., are transferred/received via the plurality of pins DQ. For convenience, the following descriptions are provided, focusing on a read operation as an embodiment.

According to an embodiment, the CPU 220 controls data exchange between the host interface 210, the RAM 230, the ROM 240, the buffer 250, and the memory interface 260 via the bus. The CPU 220 generates the command CMD to program data to the nonvolatile memory device 100 or to read or erase data from the nonvolatile memory device. Furthermore, the CPU 220 generates a program command, a read command, and an erase command.

According to an embodiment, the RAM 230 is an operation memory of the CPU 220 and may be implemented as a dynamic RAM (DRAM) or a static RAM (SRAM). The ROM 240 stores program code for operating the controller 200. The program code can be stored in the form of firmware in the ROM 240. The buffer 250 may be implemented as a volatile memory such as a DRAM, SRAM, or dual-port SRAM.

According to an embodiment, communication between the host HOST and the controller 200 is performed via the host interface 210. In an embodiment, the host HOST transfer data to the controller 200 to be programmed to the nonvolatile memory device 100 via the host interface 210 in response to a program request, and the controller 200 generates a page address of a page of the nonvolatile memory device 100 in which data is to be stored and/or a word line address corresponding to the page in response to a program request. In an embodiment, the host HOST transfers to the controller 200 a logic area of data to be read from the nonvolatile memory device 100 via the host interface 210 in response to a read request, and the controller 200 generates a page address of a physical area that corresponds to the logic area.

According to an embodiment, the controller 200 and the nonvolatile memory device 100 communicate with each other via the memory interface 260. The memory interface 260 corresponds to the input/output interface 170 described above with reference to FIG. 1, and the memory interface 260 and the input/output interface 170 are electrically connected to each other via the plurality of pins DQ.

Figure 5:
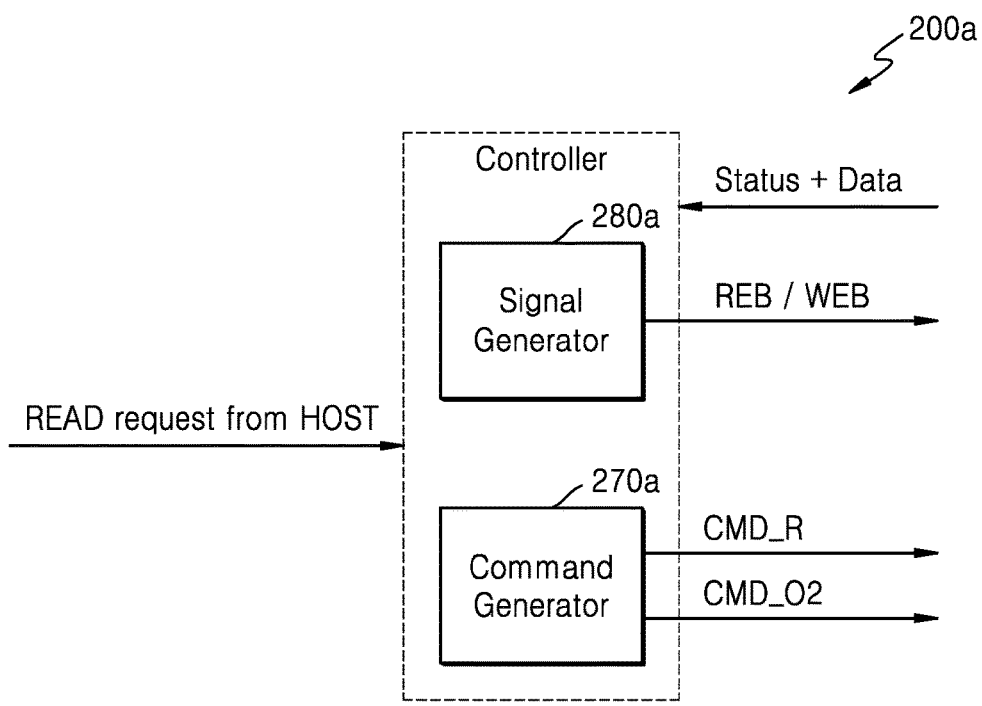
FIG. 5 is a block diagram that more specifically illustrates a controller according to an embodiment.

FIG. 5 is a block diagram that more specifically illustrates a controller according to an embodiment. Reference is also made to FIGS. 1, 3, and 4.

According to an embodiment, a controller 200a includes a command generator 270a and a signal generator 280a. The command generator 270a and the signal generator 280a constitute the memory interface 260 illustrated in FIG. 4. However, embodiments are not limited thereto, and, thus, the command generator 270a and the signal generator 280a may be implemented as, for example, software or firmware, and are executed by the CPU 220.

According to an embodiment, the controller 200a receives a read request via the host interface 210 and receives the status information signal Status and the read data Data via the memory interface 260.

According to an embodiment, the command generator 270a issues the read command. CMD_R in response to a read request received from the host. Furthermore, the command generator 270a issues the second readout command CMD_O2 a first time interval after generating the read command CMD_R. The read command CMD_R includes a command issued that allows the nonvolatile memory device 100 to read data from a memory cell array, and the second readout command CMD_O2 includes a command for outputting, to the controller 200, the read data Data and the status information signal Status that indicate whether the nonvolatile memory device 100 has completed a reading operation. The status information signal Status includes a ready status READY that indicates that a read operation of the nonvolatile memory device 100 has been completed, and a busy status BUSY that indicates that the read operation of the nonvolatile memory device 100 has not been completed.

According to an embodiment of the inventive concept, the second readout command CMD_O2 generated by the command generator 270a is output to the nonvolatile memory device 100, and the nonvolatile memory device 100 outputs both the read data Data and the status information signal Status about the nonvolatile memory device 100 to the controller 200 in response to the second readout command CMD_O2.

According to an embodiment, the signal generator 280a generate the read enable signal REB and the write enable signal WEB in response to a read request received from the host and outputs the read enable signal REB and the write enable signal WEB to the nonvolatile memory device 100 via the memory interface 260.

According to an embodiment, the write enable signal WEB toggles to issue a plurality of commands CMD. Furthermore, the read enable signal REB is synchronized with the data strobe signal DQS which functions as a reference clock for outputting data of the nonvolatile memory device 100. In other words, the read enable signal REB is generated to output data of the nonvolatile memory device 100.

According to an embodiment, the controller 200a may receive data or stop receiving data based on the status information signal Status. In detail, the controller 200a continues to receive the read data Data in response to reception of the ready status READY and stops receiving data in response to reception of the busy status BUSY. In the case of the busy status BUSY, the read data Data received until the controller 200a confirms the busy status BUSY can be discarded. According to an embodiment, in the case of data read until the busy status BUSY is confirmed, the data may include faulty memory cell address information or power information about the nonvolatile memory device 100 instead of the read data Data of the nonvolatile memory device 100, which is discarded so that received data can be utilized.

In an embodiment, the command CMD is transferred from the controller 200 to the nonvolatile memory device 100 using the same input/output channel as the data Data. For example, the controller 200 transfers the command CMD to the nonvolatile memory device 100 via an input/output channel, and, thereafter, transfers the data Data to be programmed to the nonvolatile memory device 100 or receives the read data Data read from the nonvolatile memory device 100 via an input/output channel. However, embodiments of the inventive concept are not limited thereto, and, in other embodiments, a channel through which the command CMD is transferred is separate from a channel through which the data Data is transferred. For convenience, FIGS. 1 and 5 illustrate a channel implemented via an input/output interface.

Figure 6:
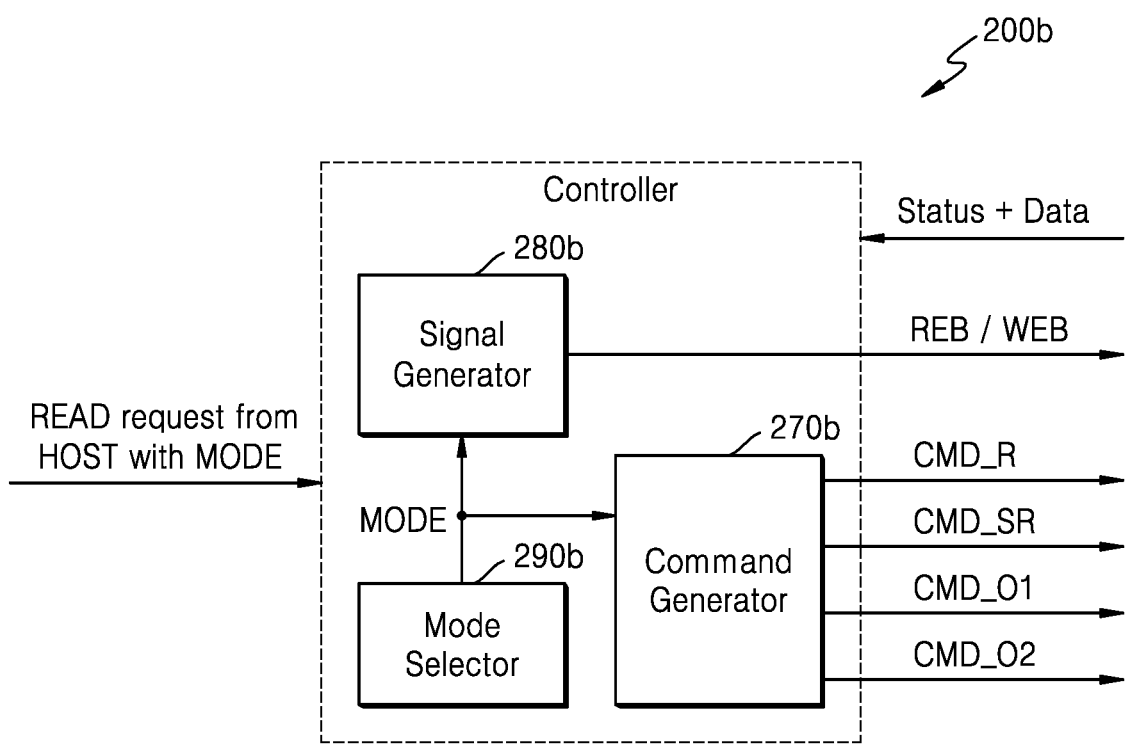
FIG. 6 is a block diagram that more specifically illustrates a controller according to another embodiment.

FIG. 6 is a block diagram that illustrates a controller according to another embodiment. Reference is also made to FIGS. 1, 3, and 4.

According to an embodiment, a controller 200b includes a command generator 270b and a signal generator 280b, and further includes a mode selector 290b. The command generator 270b and the signal generator 280 have functions similar to those of the command generator 270a and the signal generator 280a of FIG. 5, and, thus, a repeat of the descriptions given above with reference to FIG. 5 are omitted below.

According to an embodiment, the controller 200b receives a read request and a read mode via the host interface 210. The read mode includes a first read mode and a second read mode.

According to an embodiment, the mode selector 290 applies a mode signal MODE to the command generator 270b and the signal generator 280b according to the received read mode. The command generator 270b and the signal generator 280b control, based on the mode signal MODE, the nonvolatile memory device 100 to operate in the first read mode or the second read mode.

According to an embodiment, the command generator 270b further issues the status read command CMD_SR and the first readout command CMD_O1 in addition to the above-described read command CMD_R and second readout command CMD_O2. The status read command CMD_SR is issued to allow the nonvolatile memory device 100 to output the status information signal Status that indicates whether a read operation has been completed, after the read command CMD_R is issued. The first readout command CMD_O1 is issued to allow the nonvolatile memory device 100 to output the read data Data when the ready status READY indicates that a read operation of the nonvolatile memory device 100 has been completed.

According to an embodiment, the controller 200 issues the read command CMD_R, the status read command CMD_SR, and the first readout command CMD_O1 in the first read mode, and issues the read command CMD_R and the second readout command CMD_O2 in the second read mode. However, embodiments are not limited thereto, and in other embodiments, the read mode may include combinations of various commands CMD.

According to an embodiment, the host HOST may request the read mode in response to a user input, or determine the read mode according to a predetermined criterion. The read mode determines whether the storage device 10 operates in the first read mode or the second read mode.

Figure 7:
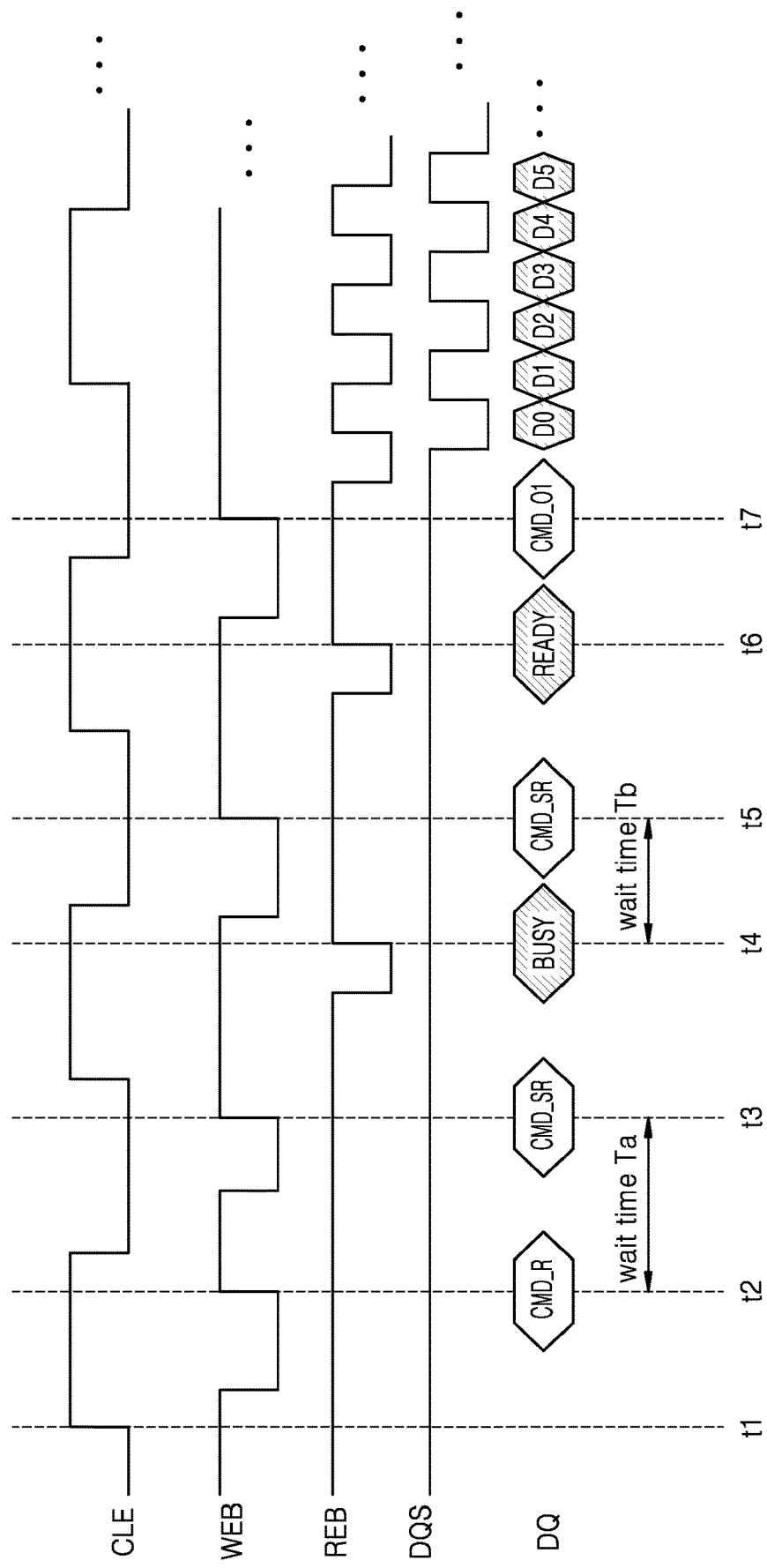
FIG. 7 is a timing diagram that illustrates a time sequence of signals and commands generated and issued in a first read mode according to an embodiment.
Figure 8:
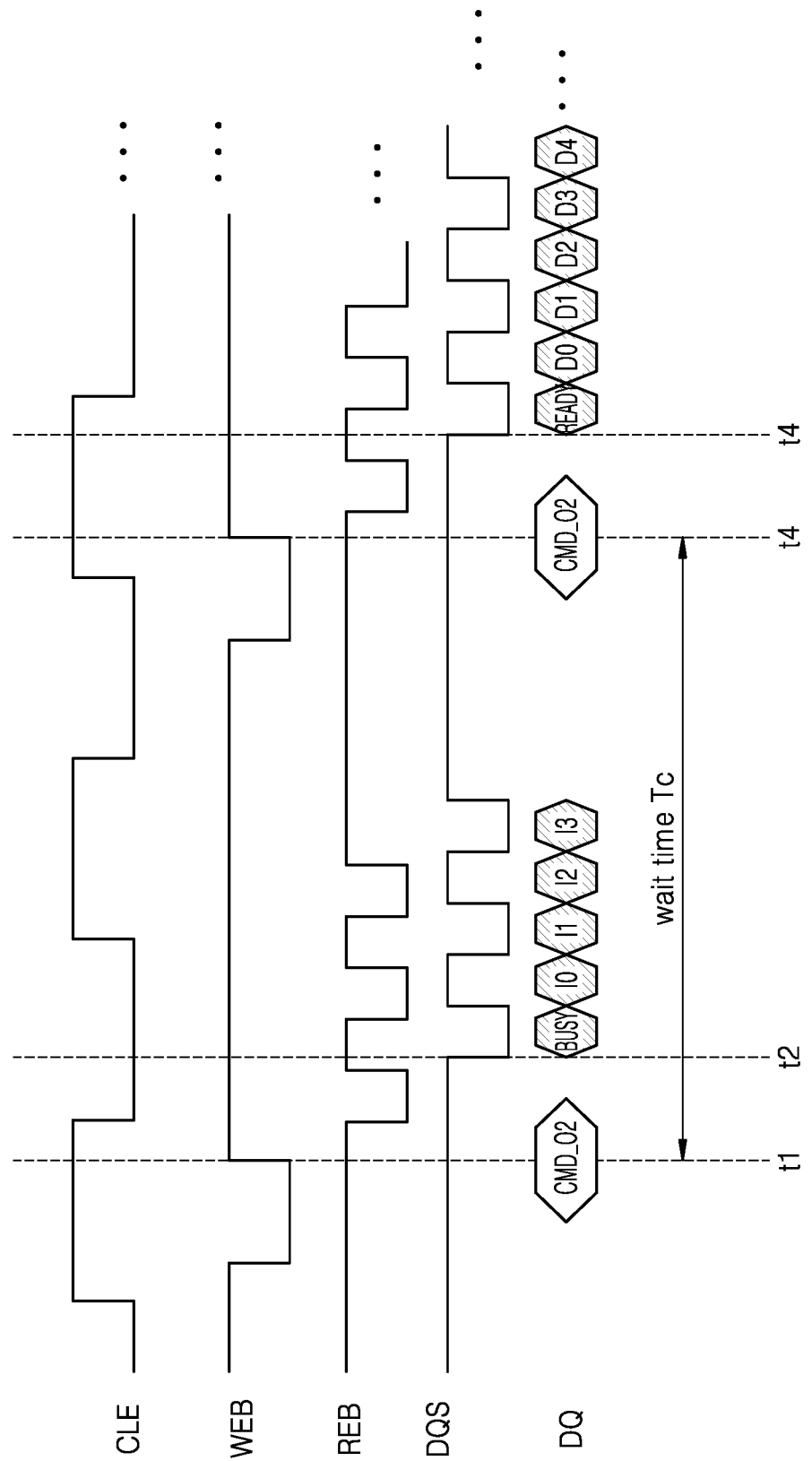
FIG. 8 is a timing diagram that illustrates a time sequence of signals and commands generated and issued in a second read mode according to an embodiment.
Figure 9:
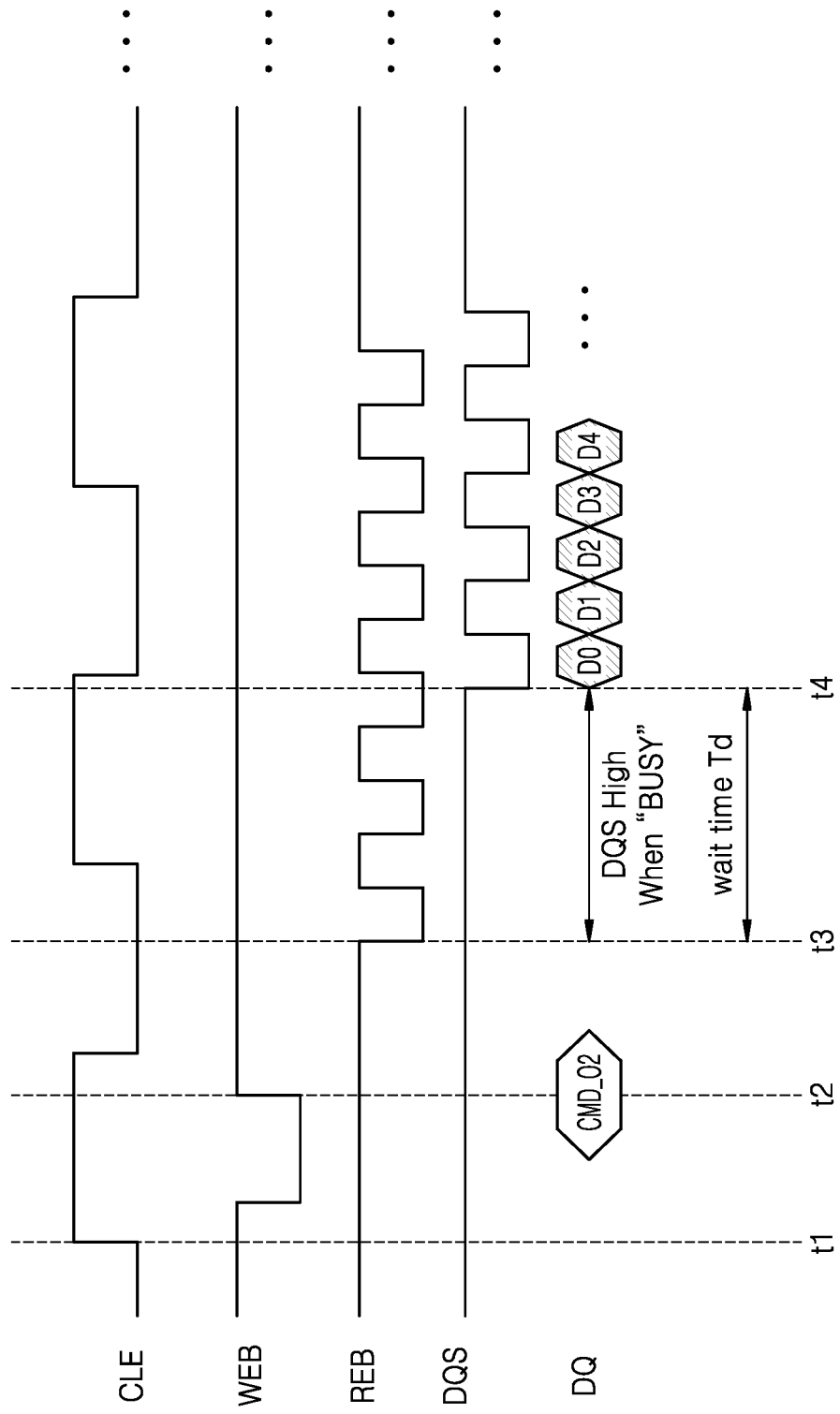
FIG. 9 is a timing diagram that illustrates a time sequence of signals and commands generated and issued in a second read mode according to another embodiment.

FIGS. 7 to 9 are timing diagrams that illustrate signals and commands generated according to a read mode. In the timing diagrams of FIGS. 7 to 9, the horizontal axis denotes time, and the vertical axis denotes a high (or data "1")/low (or data "0") signal level. The storage device 10 according to a present embodiment may correspond to an embodiment of the storage device 10 of FIG. 1, and the above descriptions provided above with reference to FIGS. 1, 3, 5, and 6 apply to a present embodiment. The descriptions given above with reference to FIGS. 1, 3, 5, and 6 are omitted below.

FIG. 7 is a timing diagram that illustrates a time sequence of signals and commands generated and issued in a first read mode, according to an embodiment.

According to an embodiment, a command latch enable signal CLE is transferred from the controller 200 to the nonvolatile memory device 100. The commands CMD generated by the command generators 270a and 270b, the signals generated by the signal generators 280a and 280b, and the additional information INFO and the data Data read from the nonvolatile memory device 100 are transferred/received via the same input/output pins DQ, as described above. The controller 200 uses the command latch enable signal CLE to differentiate data items transferred/received via the same input/output pins DQ, for example, the command CMD, the signals, the data Data, and the additional information INFO.

According to an embodiment, at a time point t1, the controller 200 toggles the command latch enable signal CLE for a read operation. After elapse of a predetermined time, the controller 200 toggles the write enable signal WEB, and at a time point t2 that is a transition time point, such as a rising edge or a falling edge, of the write enable signal WEB, the read command CMD_R is issued and transferred to the nonvolatile memory device 100. Although FIG. 7 illustrates that the read command CMD_R is issued in synchronization with a first rising edge (t2) of the write enable signal WEB, the read command CMD_R may be issued in synchronization with a falling edge of the write enable signal WEB.

According to an embodiment, the nonvolatile memory device 100 reads data from the memory cell array 130 in response to the read command CMD_R. A predetermined time may be required to read written data.

According to an embodiment, at a time point t3 after waiting, a first time interval Ta after the read command CMD_R is issued, the controller 200 issues the status read command CMD_SR. The status read command CMD_SR is issued at a second rising edge of the write enable signal WEB. Here, the first time interval Ta corresponds to a time estimated for reading data written to the nonvolatile memory device 100.

According to an embodiment, the nonvolatile memory device 100 outputs, in response to the status read command CMD_SR, the status information signal Status that indicates whether a read operation of the memory cell array to the controller 200 has been completed.

Hereinafter, according to an embodiment, it is assumed that the status information signal Status indicates the busy status BUSY.

According to an embodiment, the controller 200 transitions a level of the read enable signal REB to receive the status information signal Status. Accordingly, the controller 200 receives the busy status BUSY at a rising edge of the read enable signal REB at time point t4.

According to an embodiment, after confirming that a read operation of the nonvolatile memory device 100 has not been completed, the controller 200 reissues the status read command CMD_SR at a time point t5 after waiting for a second time interval Tb. Here, the second time interval Tb is obtained by subtracting a time between the time of issuance of the read command CMD_R, i.e., time point t2, and the time of confirmation of the busy status BUSY, i.e., time point t4, from the time estimated for reading data written to the nonvolatile memory device 100.

According to an embodiment, the nonvolatile memory device 100 outputs to the controller 200 at a time point t6, in response to the status read command CMD_SR received at time point t5, the status information signal Status that indicates whether a read operation of the memory cell array 130 has been completed. In particular, the nonvolatile memory device 100 outputs to the controller 200 at time point t6 the ready status READY that indicates that reading from the memory cell array 130 has been completed.

According to an embodiment, at time point t6, the controller 200 confirms that a reading operation of the nonvolatile memory device 100 has been completed, and, at a time point t7, the controller 200 issues the first readout command CMD_O1 to receive the read data Data. Since the first readout command CMD_O1 has been issued, the controller 200 begins toggling the read enable signal REB.

According to an embodiment, the nonvolatile memory device 100 outputs the read data Data to the controller 200 in response to the first readout command CMD_O1. The nonvolatile memory device 100 outputs the read data Data according to a rising edge and/or falling edge of the data strobe signal DQS synchronized with the read enable signal REB. Since all of required commands CMD have been issued, a level of the write enable signal WEB will not transition until a new read operation or write operation is performed.

According to an embodiment, operation of the storage device 10 has been described on the assumption that the status information signal Status indicates the busy status BUSY.

According, to an embodiment, when the status information signal Status indicates the ready status READY, the above-described operations at time points t4 and t5 may be skipped. For example, after the status read command CMD_SR is issued at time point t3, when it is confirmed that the status information signal Status received by the controller 200 indicates the ready status READY, the controller 200 issues the first readout command CMD_O1 rather than the status read command CMD_SR.

FIG. 8 is a timing diagram that illustrates a time sequence of signals and commands generated and issued in a second read mode according to an embodiment. With regard to the command latch enable signal CLE and the write enable signal WEB, the descriptions given above with reference to FIG. 7 are omitted below. Furthermore, it is assumed that the read command CMD_R for a read operation of a memory cell array has been issued.

According to an embodiment, the controller 200 issues and transfers the second readout command CMD_O2 to the nonvolatile memory device 100. The controller 200 transitions a level of the write enable signal WEB to issue the second readout command CMD_O2. The second readout command CMD_O2 is issued at a first rising edge of the write enable signal WEB at time point t1.

According to an embodiment, after the second readout command CMD_O2 has issued, the controller 200 begins toggling the read enable signal REB.

According to an embodiment, the nonvolatile memory device 100 begins, at time point t2, outputting a data stream via the input/output pins DQ according to a rising edge and/or falling edge of the data strobe signal DQS that is synchronized with the read enable signal REB.

For example, according to an embodiment, the nonvolatile memory device 100 may output the busy status BUSY of the status information signal Status in response to the second readout command CMD_O2. When a read operation of the memory cell array 130 has not been completed, the nonvolatile memory device 100 outputs, to the controller, the additional information INFO (I0-I3) about the nonvolatile memory device 100 together with the status information signal Status indicating, the busy status BUSY. For example, the additional information INFO may include power information about the nonvolatile memory device 100 or an address of a faulty memory cell. Furthermore, the additional information INFO may include a variety of information other than the written data that is indicative of a status of the nonvolatile memory device 100.

According to an embodiment, the controller 200 receives the status information signal Status that indicates the busy status BUSY at a time point t2, and, thereafter, receives the additional information INFO. After confirming the busy status BUSY, the controller 200 reissues the second readout command CMD_O2 at a time point t3 after waiting for a third time interval Tc. The second readout command CMD_O2 is issued at a second rising edge of the write enable signal WEB at time point t3. Here, the third time interval Tc is obtained by subtracting a time difference between a point of time of first issuance of the second readout command CMD_O2, i.e. time point t1, and a point of time of second issuance of the second readout command CMD_O2, i.e. time point t3, from the time estimated for reading data written to the nonvolatile memory device 100.

According to an embodiment, since the second readout command CMD_O2 has reissued, the controller 200 begins toggling the read enable signal REB again. The nonvolatile memory device 100 outputs the status information signal Status and the read data Data to the controller 200 in response to the second readout command CMD_O2.

In an embodiment, the nonvolatile memory device 100 outputs the status information signal Status indicating the ready status READY and the read data Data according to a rising edge and/or falling edge of the data strobe signal DQS that is synchronized with the read enable signal REB. The controller 200 confirms that the status information signal Status indicates the ready status READY and entirely receives the data stream. In an embodiment, both the read data Data and the status information signal. Status are included in the data stream, and the read data Data is transferred at each edge of the data strobe signal DQS. The read data Data is output via the plurality of pins DQ included in the input/output interface 170 of the nonvolatile memory device 100. Each of the data items D0-D4 illustrated in FIG. 8 are transferred simultaneously to the controller 200 via the plurality of pins DQ.

FIG. 9 is a timing diagram that illustrates a time sequence of signals and commands generated and issued in a second read mode according to another embodiment. The descriptions given above with reference to FIGS. 7 and 8 are omitted below. Furthermore, it is assumed that the read command CMD_R for a read operation of a memory cell array has been issued. The same operation as described above with reference to FIG. 8 is performed until a time point t2.

FIG. 9 illustrates operation of the storage device 10 operating in the second read mode, according to an embodiment. In the second read mode, the nonvolatile memory device 100 generates the status information signal Status, but does not output the status information signal Status to the controller 200 and controls an internal signal using the status information signal Status. That is, the status information signal Status is an internal signal generated in the control logic 110 as a result of predicting whether a read operation of the nonvolatile memory device 100 has been completed.

According to an embodiment, after the second readout command CMD_O2 is issued at the second time point t2, the controller 200 begins toggling the read enable signal REB at time point t3.

According to an embodiment of the inventive concept, the nonvolatile memory device 100 generates the read data Data in response to the second readout command CMD_O2. The nonvolatile memory device 100 confirms the busy status BUSY and delays toggling the data strobe signal DQS for a fourth time interval Td. The controller 200 continues toggling the read enable signal REB regardless of the status information signal Status. Here, the fourth time interval Td is obtained by subtracting, a time difference between the time of issuance of the second readout command CMD_O2, i.e., time point t2 and the time of toggling of the read enable signal REB, i.e., time point t3, from the time estimated for reading the data written to the nonvolatile memory device 100.

According to an, embodiment, the nonvolatile memory device 100 begins toggling the data strobe signal DQS at a time point t4 after delaying toggling of the data strobe signal DQS for the fourth time interval Td. The controller 200 sequentially receives the read data items Data (D0-D4).

Figures 10, 11:
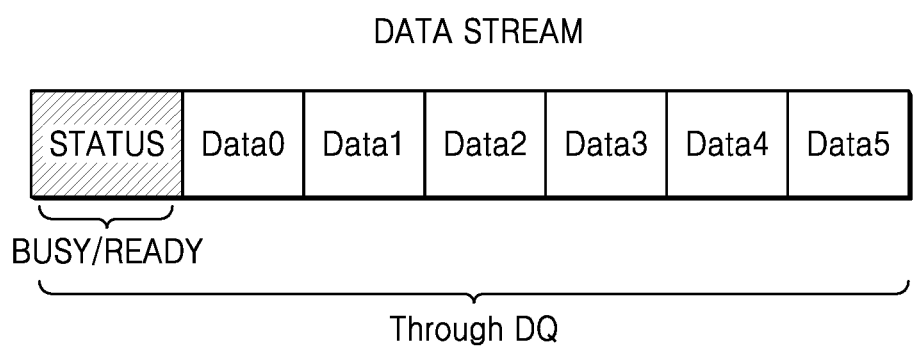
FIG. 10 illustrates a data stream generated by a nonvolatile memory device according to an embodiment.
FIGS. 11 and 12 illustrate tables in which signals and commands issued for each mode are classified, according to an embodiment.

FIG. 10 illustrates a data stream generated by a nonvolatile memory device, according to an embodiment. Reference is also made to FIGS. 1, 3, and 5.

According to an embodiment, a data stream output from the nonvolatile memory device 100 to the controller 200 via the input/output interface 170 includes the status information signal Status and the read data Data.

According to an embodiment, the status information signal Status may include a ready status READY that indicates that the operation of reading from the memory cell array 130 has been completed and a busy status BUSY that indicates that the operation of reading from the memory cell array 130 has not been completed.

According to an embodiment, the status information signal Status is output to the controller 200 via at least one pin DQ of the input/output interface 170. A data size of the status information signal Status may be, but is not limited to, from one bit to several bytes.

According to an embodiment, the read data Data is read from the memory cell array 130 and output via the plurality of pins DQ of the input/output interface 170. The read data Data may include a plurality of data sets, and may include, for example, signals simultaneously output via the plurality of pins DQ.

According to an embodiment, the read data Data may include first to fifth data sets. The read data Data is separately output in units of at least one word to construct a data set. For example, each of the first to fifth data sets may be signals simultaneously output via the plurality of data pins DQ.

According to an embodiment, the first data Data0 is additional information INFO other than the read data Data. For example, in the case of the busy status BUSY, the nonvolatile memory device 100 generates the additional information INFO that includes a faulty memory cell address or power status of the nonvolatile memory device 100, outputs the status information signal. Status indicating the busy status BUSY to the controller 200, and, at the same time or thereafter, outputs the additional information to the controller 200.

Figure 12:
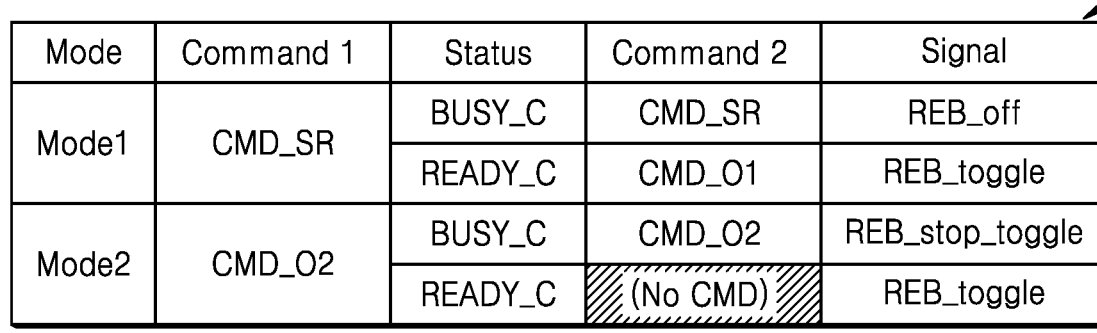

FIGS. 11 and 12 illustrate tables in which signals and commands issued for each mode are classified, according to an embodiment.

FIG. 11 illustrates a table T1 in which commands issued for each mode are classified.

Referring to FIG. 11, according to an embodiment, the controller 200 issues the read command CMD_R, the status read command CMD_SR, and the first readout command CMD_O1 in the first read mode.

According to an embodiment, the controller 200 issues the read command CMD_R and the second readout command CMD_O2 in the second mode.

In other words, according to an embodiment, the controller 200 issues the read command CMD_R regardless of a read mode to read data written to the memory cell array 130. Furthermore, the controller 200 generates the read enable signal REB to read out the read data.

FIG. 12 illustrates a table T2 in which signals and commands issued for each mode are classified in more detail. The descriptions given above with reference to FIGS. 1 to 11 are omitted below. Furthermore, it is assumed that the read command CMD_R has been issued. Reference is also made to FIGS. 1, 5, and 12.

In the first read mode, according to an embodiment, the status information signal Status has been confirmed since the status read command CMD_SR is issued. When the status information signal Status indicates the busy status BUSY, the status read command CMD_SR is reissued. Here, the read enable signal REB is in an off state REB_off, i.e., not toggling. When the status information signal Status indicates the ready status READY, the first readout command CMD_O1 is issued. Here, the read enable signal REB begins to toggle.

In the second read mode, according to an embodiment, since the second readout command CMD_O2 is issued, the status information signal Status has been confirmed, and the read enable signal REB begins to toggle. When the status information signal Status indicates the busy status BUSY, the second readout command CMD_O2 is reissued. Here, the read enable signal REB stops toggling. When the status information signal Status indicates the ready status READY, an additional command is not issued, and toggling of the read enable signal REB is maintained.

Figure 13:
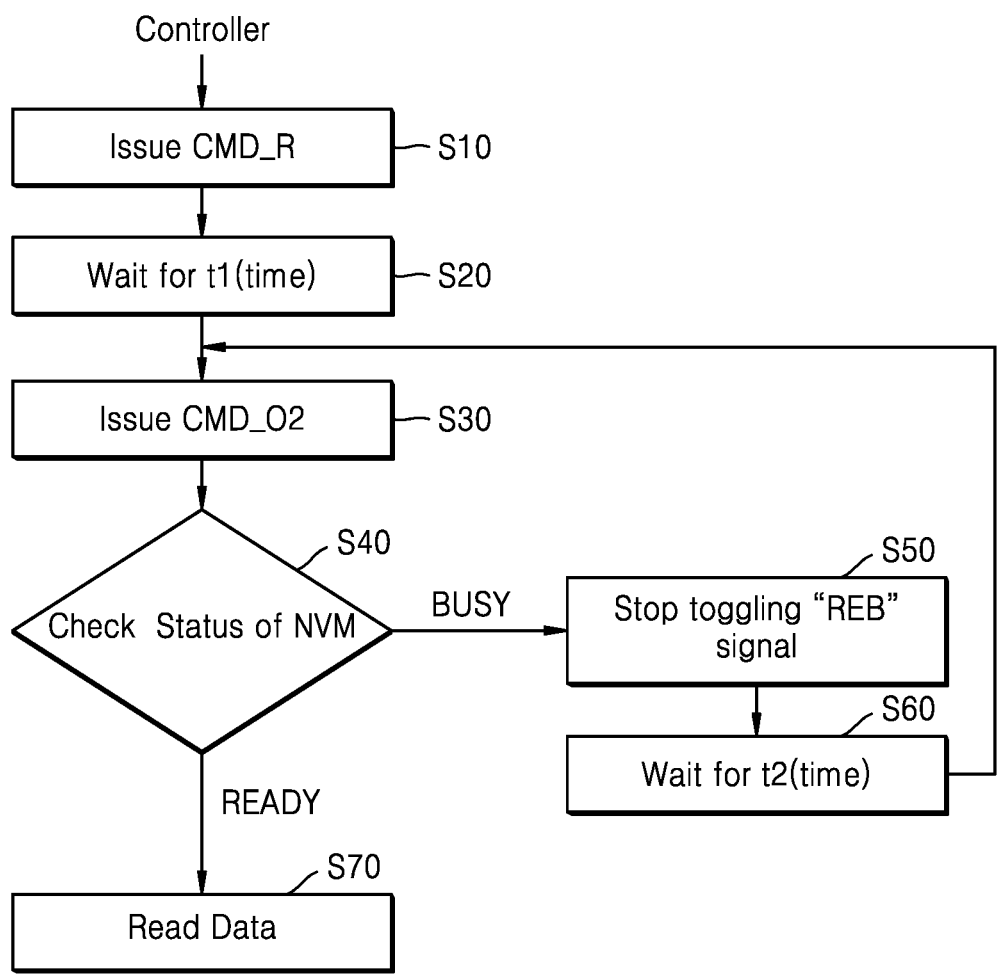
FIG. 13 is a flowchart of a method of operating a controller according to an embodiment.

FIG. 13 is a flowchart of a method of operating a controller according to an embodiment. Reference is also made to FIGS. 1, 3, 5, and 8.

According to an embodiment, the controller 200 receives a read request from a host. The controller 200 issues the read command CMD_R in response to the read request (S10).

The controller 200 waits for a first time interval t1 estimated for the memory cell array 130 to completely read the written data (S20).

The controller 200 issues the second readout command CMD_O2 that allows the nonvolatile memory device 100 to output both the status information signal Status and the read data Data (S30). The controller 200 begins toggling the read enable signal REB when the second readout command CMD_O2 is issued.

The controller 200 receives the status information signal Status from the nonvolatile memory device 100 in response to the second readout command CMD_O2, and confirms whether the received status information signal Status indicates the busy status BUSY or the ready status READY (S40). Furthermore, the additional information INFO or the read data Data may be received together with the status information signal Status from the nonvolatile memory device 100.

When the confirmed status information signal Status indicates the busy status BUSY, the controller 200 stops toggling the read enable signal REB (S50), and waits for a second time interval t2 that corresponds to a time required for completing a read operation (S60).

When the confirmed status information signal Status indicates the ready status READY, the controller 200 receives the read data Data and transfers the read data Data to the host HOST (S70).

Figure 14:
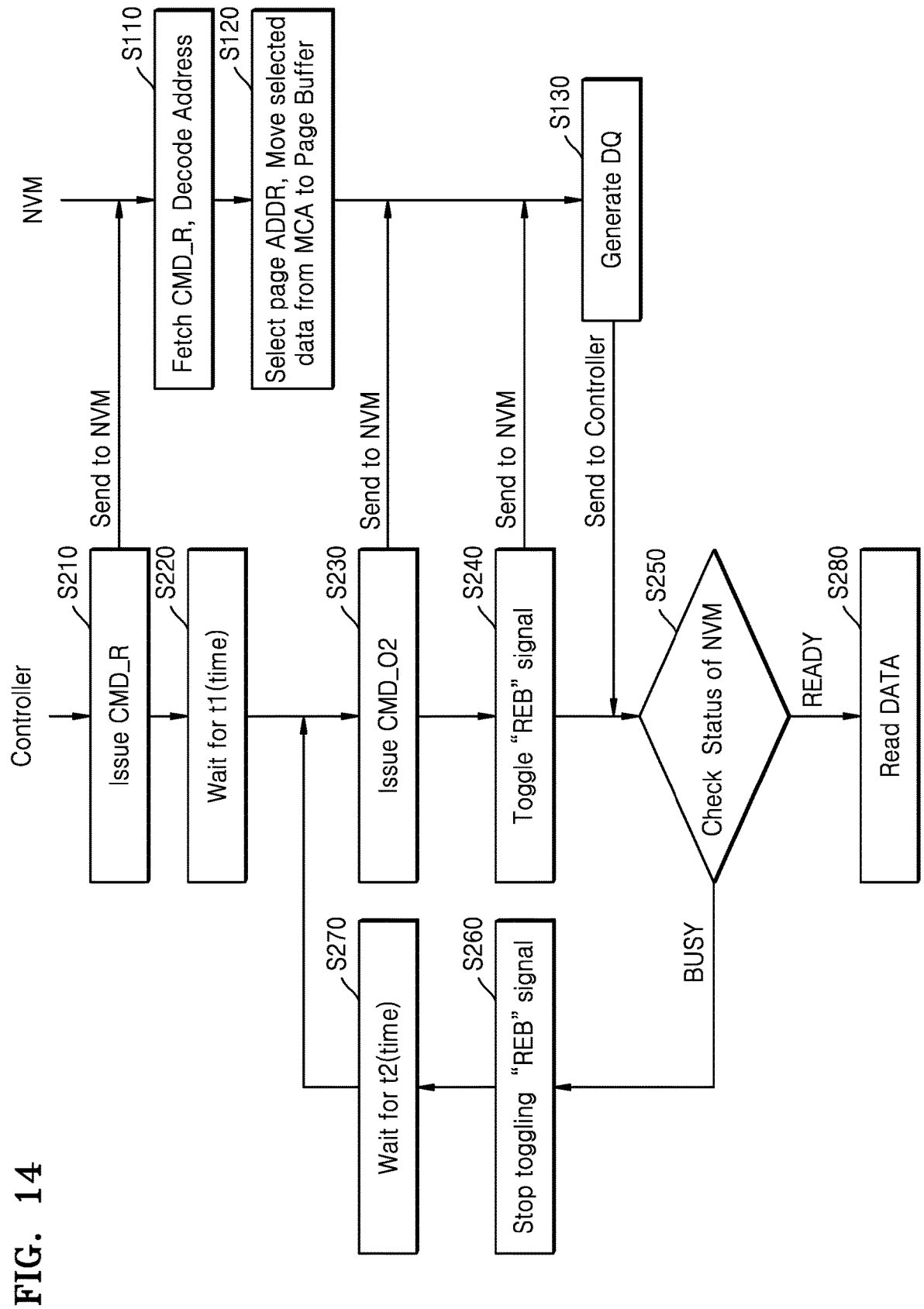
FIG. 14 is a detailed flowchart of a method of operating a storage device that includes a controller and a nonvolatile memory device according to an embodiment.

FIG. 14 is a detailed flowchart of, a method of operating a storage device that includes a controller and a nonvolatile memory device according to an embodiment. Reference is also made to FIGS. 1, 3, 5, 8, and 13, and the descriptions given above with reference to FIGS. 1, 3, 5, 8, and 13 are omitted below.

According to an embodiment, the controller 200 issues the read command CMD_R in response to a read request from the host HOST (S210), and the read command CMD_R is transferred to the nonvolatile memory device 100.

The controller 200 waits for a first time interval t1 estimated for the memory cell array 130 to completely read the written data (S220). The nonvolatile memory device 100 fetches the read command CMD_R and decodes an address of a memory cell to be read according to the read command CMD_R (S110). The nonvolatile memory device 100 selects a page address and outputs data of a selected memory cell from the memory cell array (MCA) 130 to the page buffer 150 (S120). For example, operation S120 may be performed during the first time interval t1.

After the elapse of the first time interval t1, the controller 200 issues the second readout command CMD_O2 that allows the nonvolatile memory device 100 to output both the status information signal Status and the read data Data (S230), and the issued second readout command CMD_O2 is transferred to the nonvolatile memory device 100.

In response to receiving the second readout command CMD_O2, the nonvolatile memory device 100 generates a data stream for transferring the status information signal Status and the read data Data to the controller 200 via the plurality of pins DQ in the input/output interface 170 (S130).

The controller 200 begins toggling the read enable signal REB when the second readout command CMD_O2 is issued (S240), and confirms the status information signal Status (S250).

When the confirmed status information signal Status indicates the busy status BUSY, the controller 200 stops toggling the read enable signal REB (S260), waits for a second time interval t2 that corresponds to a time required for completing a read operation (S270), and reissues the second readout command CMD_O2 after waiting for the second time interval t2 (to S230).

When the confirmed status information signal Status indicates the ready status READY, the controller 200 receives the read data Data and transfers the read data Data to the host HOST (S280).

Figure 15:
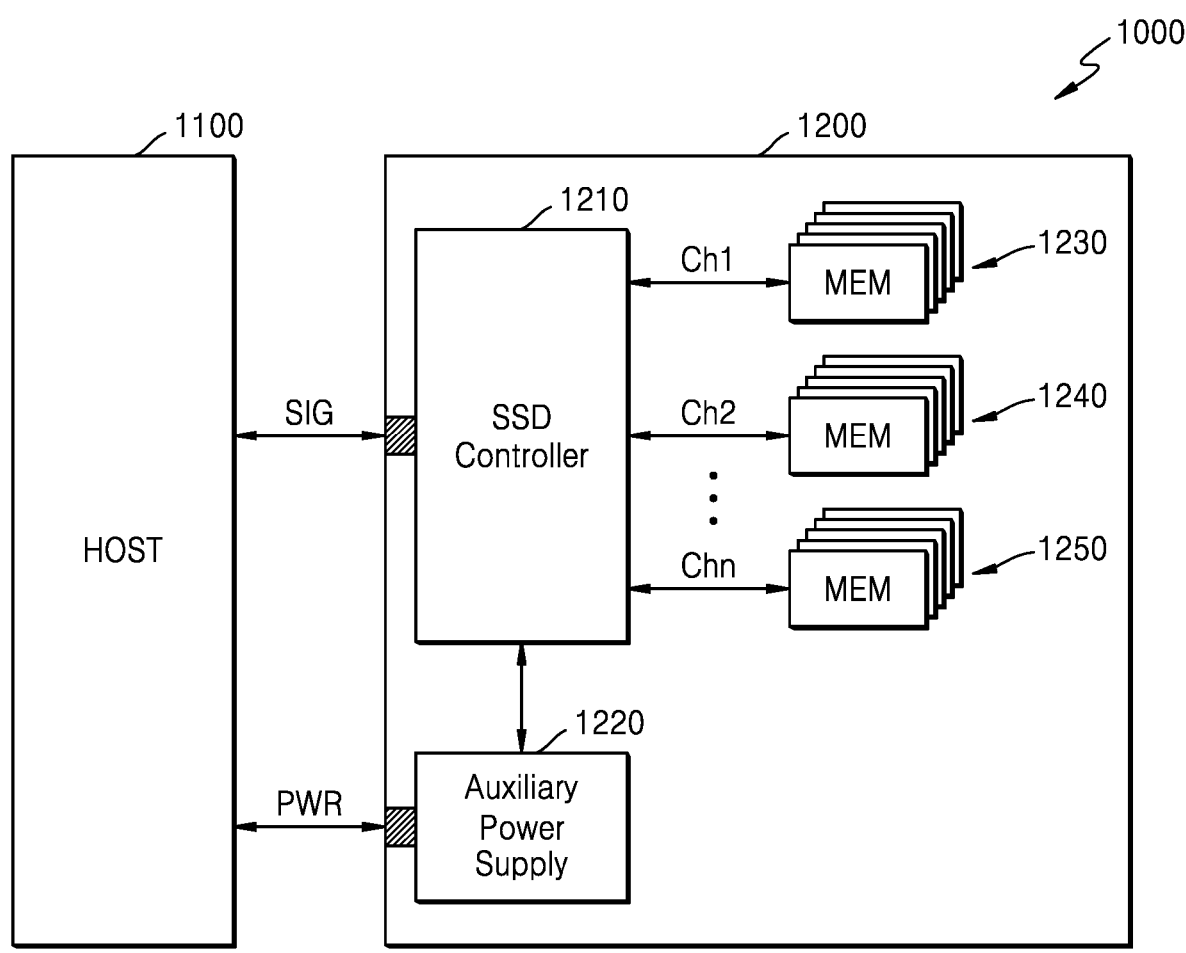
FIG. 15 is a block diagram of a storage device that includes a controller and a nonvolatile memory device, according to an embodiment.

FIG. 15 is a block diagram of a storage device that includes a controller and a nonvolatile memory device, according to an embodiment.

Referring to FIG. 15, according to an embodiment, an SSD system 1000 includes a host 1100 and an SSD 1200. The SSD 1200 exchanges a signal SIG with the host 1100 via a signal connector, and the host 1100 receives power PWR via a power connector. The SSD 1200 includes an SSD controller 1210, an auxiliary power supply 1220, and memory devices 1230, 1240, and 1250. The memory devices 1230, 1240, and 1250 are connected to the SSD controller 1210 via channels Ch1, Ch2, and Chn respectively.

According to an embodiment, the SSD controller 1210 can be implemented using the controllers 200, 200*a*, and 200*b* described above with reference to FIGS. 1 to 14. In detail, the SSD controller 1210 receives the command CMD and various signals via the same input/output channels as those used for data, and transfers the command CMD to the memory devices 1230, 1240, and 1250 in synchronization with the write enable signal WEB. For example, the SSD controller 1210 issues the second readout command CMD for transferring both status information signal Status and read data Data of the memory devices 1230, 1240, and 1250, and the memory devices 1230, 1240, and 1250 transfer both the status information signal Status and the read data Data to the SSD controller 1210 in response to receiving the second readout command CMD.

According to an embodiment, the memory devices 1230, 1240, and 1250 are implemented using the nonvolatile memory device 100 described above with reference to FIGS. 1 to 14. In detail, each of the memory devices 1230, 1240, and 1250 receives the command CMD from the SSD controller 1210 via the same input/output channel as that used for data. For example, the memory devices 1230, 1240, and 1250 receive the status information signal Status from respective control logic circuits and receive the read data Data from respective page buffers. The memory devices 1230, 1240, and 1250 transfer the status information signal Status and the read data Data to the SSD controller 1210 in response to receiving the second readout command CMD_O2 from the SSD controller 1210. The memory devices 1230, 1240, and 1250 transfer the status information signal Status to the SSD controller 1210 before transferring the read data Data.

While embodiments of the inventive concept has been particularly shown and described with reference to exemplary embodiments thereof, it will be understood that various changes in form and details may be made therein without departing from the spirit and scope of the following claims.

What is claimed is:

1. A method of operating a storage device that includes a nonvolatile memory device and a controller that controls an operation of the nonvolatile memory device, the method comprising:
    issuing sequentially, by the controller, a first command and a second command, wherein the first command and the second command are to read first data from the nonvolatile memory device,
    wherein the second command is issued a predetermined time after the first command is issued,
    wherein the second command includes a command for outputting to the controller the first data and a status information signal that indicates whether the nonvolatile memory device has completed reading the first data from the nonvolatile memory device;
    reading, by the nonvolatile memory device, the first data from a memory cell array into a page buffer of the nonvolatile memory device, in response to the first command; and
    outputting sequentially, by the nonvolatile memory device to the controller, in response to the second command, status information indicating whether the reading of the first data from the memory cell array for the read operation according to the first command has been completed, and second data obtained from the first data read into the page buffer of the nonvolatile memory device.

2. The method of claim 1, further comprising:
    continuously receiving, by the controller, the second data from the nonvolatile memory device when the output status information indicates a ready status in which the read operation of the memory cell array has been completed; and stopping, by the controller, receiving the second data from the nonvolatile memory device when the output status information indicates a busy status in which the read operation of the memory cell array has not been completed.

3. The method of claim 2, further comprising reissuing, by the controller, the second command after waiting for a first time interval after stopping the receiving of the second data.

4. The method of claim 1, further comprising:
toggling, by the controller, a read enable signal provided to the nonvolatile memory device, after issuing the second command; and
stopping, by the controller, the toggling of the read enable signal when the output status information indicates a busy status in which the read operation has not been completed, after outputting the status information and the second data.

5. The method of claim 4, further comprising, by the nonvolatile memory device, generating a data strobe signal synchronized with the read enable signal and outputting the second data in synchronization with a rising edge and a falling edge of the data strobe signal.

6. The method of claim 1, wherein the outputting further comprises outputting third data during a busy status in which the read operation of the memory cell array has not been completed.

7. The method of claim 6, wherein the third data is at least one of a faulty memory cell address or a power status of the memory cell array.

8. The method of claim 1, wherein the outputting further comprises outputting the second data after outputting the status information.

9. The method of claim 1, wherein the controller issues the first command and the second command when the controller is set to a second read mode, and issues the first command, a third command for outputting the status information, and a fourth command for transferring the second data when the controller is set to a first read mode.

10. A storage device comprising:
a nonvolatile memory device; and
a controller that controls the nonvolatile memory device and issues sequentially a first command and a second command, wherein the first command and the second command are to read first data from the nonvolatile memory device,
wherein the second command is issued a predetermined time after the first command is issued,
wherein the second command includes a command for outputting to the controller the first data and a status information signal that indicates whether the nonvolatile memory device has completed reading the first data from the nonvolatile memory device,
wherein the nonvolatile memory device comprises:
a memory cell array that includes a plurality of memory cells and that reads the first data in response to the first command;
a control logic that controls the read operation of the memory cell array based on the first command and the second command;
a page buffer that buffers the first data; and
an input/output interface that, in response to the second command, outputs sequentially to the controller status information indicating whether the read operation of the first data from the memory cell array for the read operation according to the first command has been completed, and second data obtained by buffering the first data in the page buffer.

11. The storage device of claim 10, wherein the nonvolatile memory device outputs the status information and the second data in synchronization with a data strobe signal, outputs the status information in synchronization with a first edge of the data strobe signal, and outputs the first data in synchronization with a second edge of the data strobe signal.

12. The storage device of claim 10, wherein the controller issues the second command after waiting for a first time interval after issuing the first command, and reissues the second command after waiting for a second time interval when the status information output from the nonvolatile memory device indicates a busy status in which the read operation of the memory cell array has not been completed.

13. The storage device of claim 10, wherein the controller outputs a read enable signal to the nonvolatile memory device, starts a toggling of the read enable signal after the second command is issued, and stops the toggling of the read enable signal when the output status information indicates a busy status in which the read operation has not been completed.

14. The storage device of claim 10, wherein the input/output interface outputs the second data after outputting the status information.

15. A method of operating a storage device that includes a nonvolatile memory device and a controller that controls an operation of the nonvolatile memory device, the method comprising:
issuing, by the controller, a first command to the nonvolatile memory device, wherein the first command is to read first data from the nonvolatile memory device;
reading, by the nonvolatile memory device, the first data from a memory cell array in response to the first command;
issuing, by the controller, in a second read mode, a second command to the nonvolatile memory device, wherein the second command is to read the first data from the nonvolatile memory device,
wherein the second command includes a command for outputting to the controller the first data and a status information signal that indicates whether the nonvolatile memory device has completed reading the first data from the nonvolatile memory device,
wherein the second command is issued a predetermined time after the first command is issued; and
transferring, by the nonvolatile memory device to the controller, the first data to the controller in response to the second command,
wherein the transferring comprises delaying an output of the first data for a first time interval and outputting the status information indicating a busy status for the first time interval, in the busy status in which the reading of the first data from the memory cell array for the read operation according to the first command has not been completed.

16. The method of claim 15, wherein the delaying further comprises completing, by the nonvolatile memory device, the reading of the first data from the memory cell array within the first time interval after receiving the second command.

17. The method of claim 15, wherein the issuing the second command comprises toggling, by the controller, a read enable signal for a second time interval after the second command is issued,
wherein the read enable signal synchronizes a data strobe signal that transfers the first data.

18. The method of claim 17, wherein the delaying further comprises:

determining the busy status; and maintaining the data strobe signal at a constant level regardless of the read enable signal.

19. The method of claim 17, wherein the nonvolatile memory device outputs the first data at each rising edge and each falling edge of the data strobe signal.

20. The method of claim 15, wherein the controller issues the first command and the second command in the second read mode, and issues the first command, a third command for outputting the status information, and a fourth command for transferring the first data in a first read mode.

\* \* \* \* \*